United States Patent [19]

Coltman et al.

[11] 4,025,805

[45] May 24, 1977

[54] CONICAL TRANSDUCER AND REFLECTOR APPARATUS

[75] Inventors: John W. Coltman, Pittsburgh; Charles H. Jones, Murrysville, both of Pa.

[73] Assignee: Westinghouse Electric Corporation, Pittsburgh, Pa.

[22] Filed: Apr. 15, 1975

[21] Appl. No.: 568,232

[52] U.S. Cl. .............................. 310/8.7; 340/8 FT

[51] Int. Cl.² .............................. H01L 41/04

[58] Field of Search .............. 310/26, 8.1, 8.3, 8.7, 310/9.1, 9.4, 9.8, 9.6; 181/142; 73/67.8, 71.5 US, 522; 340/8 R, 8 RT, 8 MM, 16

[56] References Cited

UNITED STATES PATENTS

| | | | |
|---|---|---|---|
| 2,345,472 | 3/1944 | Goldsmith | 340/8 FT |
| 2,414,495 | 1/1947 | Vang | 340/8 FT |
| 2,795,709 | 6/1957 | Camp | 310/9.6 |
| 3,030,606 | 4/1962 | Harris | 310/9.6 X |
| 3,301,936 | 1/1967 | Carman et al. | 310/9.6 X |
| 3,309,929 | 3/1967 | Simmons et al. | 310/9.8 X |
| 3,470,868 | 10/1969 | Krause et al. | 340/8 FT |

*Primary Examiner*—Mark O. Budd
*Attorney, Agent, or Firm*—D. Schron

[57] ABSTRACT

The invention provides a transducer for use with a conical reflector in which the transducer comprises a frusto-conical radiating member that is coaxially positioned with respect to the reflector member. The half angles of the radiating member and reflectors are related such that every ray from a selected point of interest on the axis that is reflected from the reflector cone to the active surface of the radiating member intersects substantially normally to the active surface.

Where the energy is directed to a point of interest distant from the reflector, the half angles are related in accordance with the formula $$\phi = \left(\frac{\pi}{4} \pm \frac{\theta}{2}\right);$$

; and, where the point of interest is on the axis, the half angles are related in accordance with the formula $$\phi = \left(\frac{\pi}{4} \pm \frac{\theta}{2}\right) - ½ \tan^{-1}\frac{R}{S}$$

where $\phi$ = conical reflector half angle;

$\theta$ = conical radiating member half angle;

R = the radius of the reflector at a point where a ray from the point of interest is reflected normally to the surface of the radiating member; and S = the distance from the radius R intersection on the axis to the point of interest on the axis.

7 Claims, 14 Drawing Figures

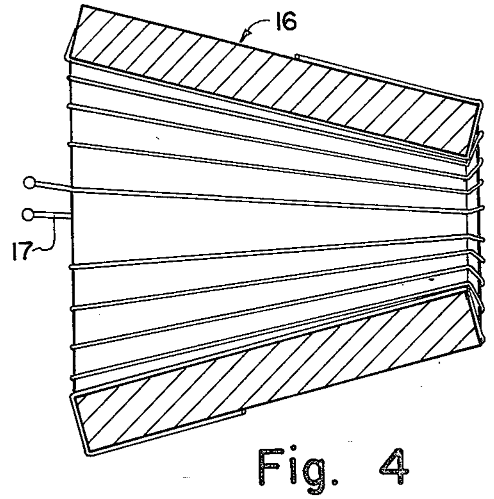
Fig. 4
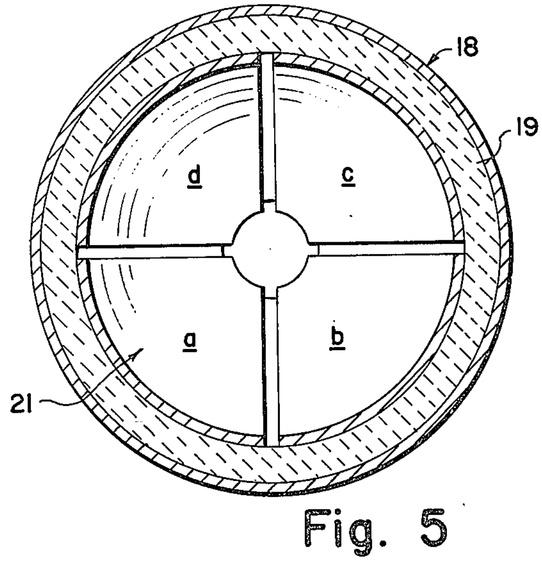
Fig. 5
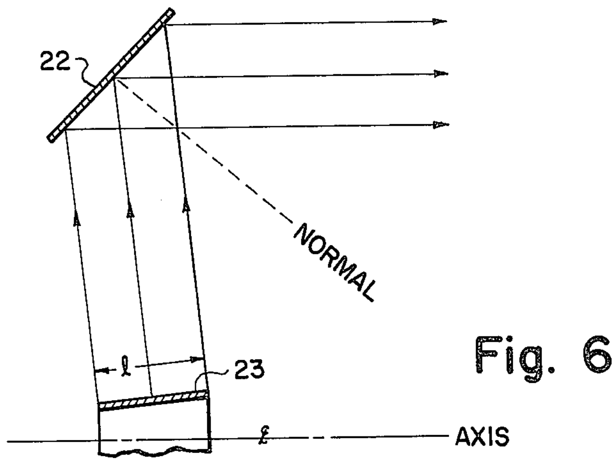
Fig. 6
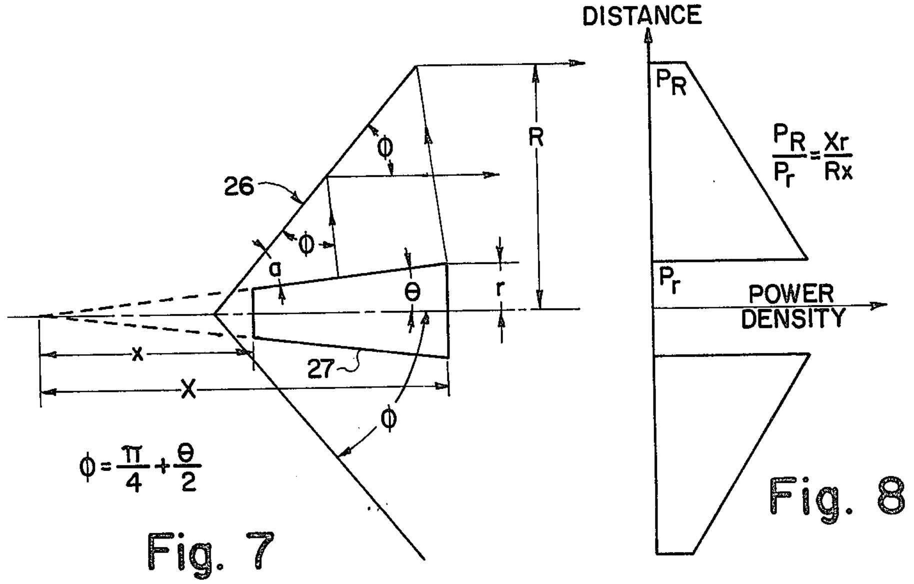
Fig. 7
Fig. 8

CONICAL TRANSDUCER AND REFLECTOR APPARATUS

FIELD OF THE INVENTION

The present invention relates to novel directional sonar antennas, and, in particular, to antennas comprising a frusto-chemical radiating member in combination with a conical reflector to provide high gain and resolution.

BACKGROUND OF THE INVENTION

The use of conical reflectors in the transmission or reception of acoustic energy is old and well known. Conical reflectors have obvious manufacturing advantages over other types of reflectors such as for example elliptically-shaped or parabolic reflectors. Moreover, various types of transducers or acoustic generators have been used in combination with conical reflectors to transmist and/or receive acoustical energy. Usually, the transducers used with conical reflectors have been of cylindrical configuration. Illustrative of these devices are U.S. Pat. Nos. 2,005,741 and 3,243,768.

It is an object of the present invention to provide a transducer for use with conical reflectors that has greater flexibility as respects shading and focusing than conventional cyclindrical transducers. It is a further object of the invention to provide a transducer which is simpler to fabricate than conventional cylindrical transducers, and provides a greater flexibility in combination with conical reflectors than a cylindrical transducer.

SUMMARY OF THE INVENTION

The present invention provides a transducer comprising a frusto-conical radiating member. The radiating member may be fabricated from a piezoelectric, electrostrictive or magnetostrictive material. Preferably, the radiating member is made of a piezoceramic material such as $BaTiO_3$, lead metaniobate, quartz, and the like.

The frusto-conical radiating member is coaxially positioned with respect to the conical reflector such that the relative positioning provides various shading and focusing parameters. The conical half angles of the radiating member and reflector members are related so that every ray from a selected point of interest on the axis that is reflected from the reflector member to the active surface of the radiating member intersects substantially normally to the active surface.

Where the energy is directed to a point of interest distant from the reflector, the half angle $\phi$ of the reflector is related to the half angle $\theta$ of the radiating member in accordance with the formula $$\phi = \frac{\pi}{4} \pm \frac{\theta}{2}.$$

And, where the point of interest is on the axis, the half angles are related in accordance with the formula $$\phi = \left(\frac{\pi}{4} \pm \frac{\theta}{2}\right) - \tfrac{1}{2} \tan^{-1} \frac{R}{S}$$

tan-1 R/S where

R = radius of the reflector at a point where a ray from the point of interest is reflected normally to the surface of the radiating member; and S = distance from the radius R intersection on the axis to the point of interest on the axis.

The radiating member or transducer is fabricated so as to transmit an approximately uniform power density from all areas about its outer surface and to make the vibratory motion of any area on the active surface of the transducer in phase with that of any other active surface location.

The energy distribution as a function of radial distance from the axis of the reflector determines the aperture distribution or shading function of the transducer. When the aperture distribution is uniform, the gain of the reflector/transducer is maximum. Conical transducers of the present invention having their apex coincidental with the apex of the reflector, provide an approximate uniform energy distribution. However, by the selective positioning of the transducer apex, tapered or inversely tapered distributions can be achieved to provide a reduction in side lobes or an increase in the resolution. Thus, by the simple expedient of coaxially moving the transducer or radiating member relative to the reflector member, various shading and aperture functions can be achieved.

While the transducers of the present invention are particularly well suited for use in fluid mediums such as in sonar applications, they are also useful with solid mediums such as in nondestructive testing of steel and the like.

Other advantages of the present invention will become apparent from a perusal of the following detailed description of presently preferred embodiments taken in connection with the accompanying drawings.

BRIEF DESCRIPTION OF THE DRAWINGS

FIG. 4 is a sectional elevation of a magnetostrictive frusto-conical radiating member for use in the combination shown in FIG. 1;

FIG. 5 is a front elevation of a frusto-conical transducer with a single outer electrode and an inner electrode divided into four 90° sections for use with a conical reflector and a servo system;

FIG. 6 is a diagrammatic view of a small frustoconical transducer and conical reflector having a power density similar to the combination of FIG. 1, but with a different shading function;

FIG. 7 is a diagrammatic view of a frusto-conical transducer having its apex positioned behind the apex of a conical reflector;

FIG. 8 is a graphical representation of the aperture distribution of the combination of FIG. 7;

PRESENTLY PREFERRED EMBODIMENTS

Figure 1:
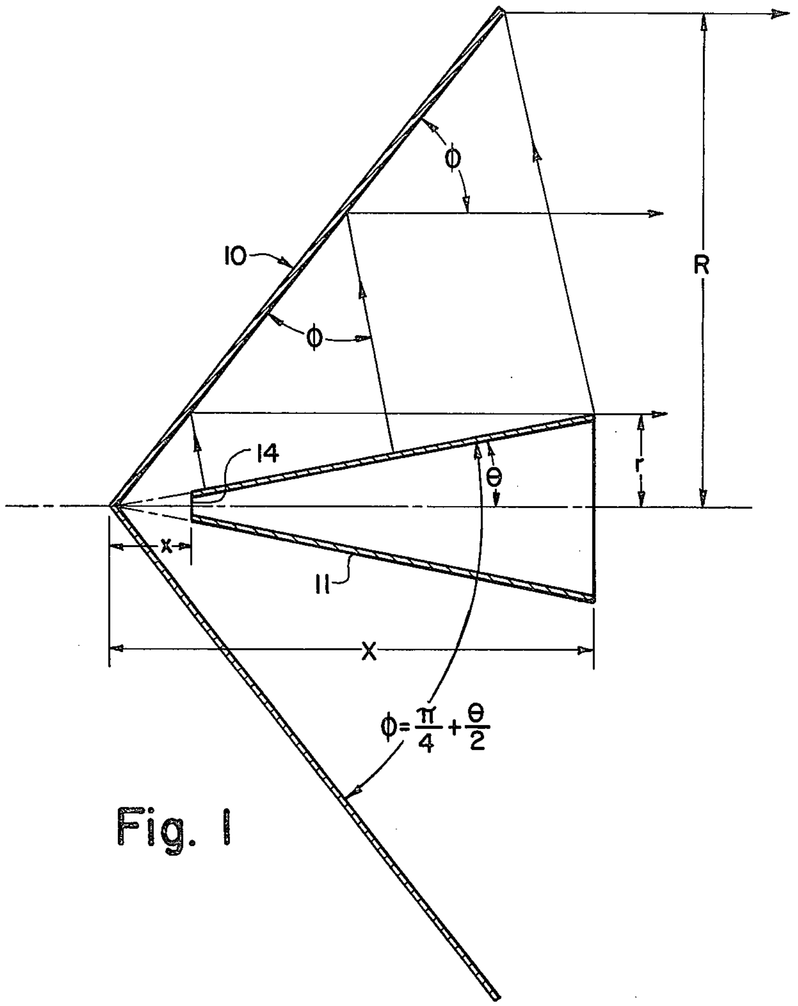
FIG. 1 is a diagrammatic sectional view of a frusto-conical transducer in combination with a conical reflector having a uniform aperture distribution.

Referring to FIG. 1, a conical reflector 10 having a radius R is provided with a frusto-conical transducer 11 having a base radius *r*. Frusto-conical transducer 11 has a conical half angle $\theta$ and a length $(X\text{-}x) > \lambda/2$, where $\lambda$ is the wavelength of the acuostic radiation.

For applications where the acoustic energy is directed at a point distant from reflector 10, the relationship between the conical reflector half angle $\phi$ and the conical half angle of the transducer is $$\phi = \left(\frac{\pi}{4} + \frac{\theta}{2}\right).$$

This relationship assures that the normal ray from the active surface of the transducer or radiating member 11 is reflected by reflector 10 parallel to the axis. For focal points closer to the reflector, the conical half angles may be modified appropriately.

Figure 2:
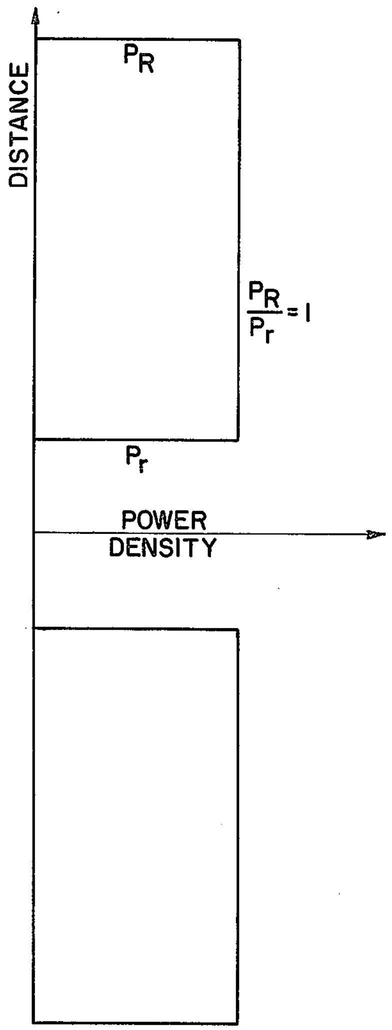
FIG. 2 is a graphical representation of the aperture distribution perpendicular to the axis of the combination shown in FIG. 1.

The aperture distribution (FIG. 2) is a plot of the energy density as a function of the radial distance from the axis of reflector 10. The area of a given frustum of the transducer cone is directly proportional to the area of the reflector frustum which it illuminates. As shown in FIG. 2, the aperture distribution for transducer 11 is substantially uniform, except for the center region, providing the maximum feed gain. The level of the first side lobes is a function of the ratio *r*/R and the beam width is equal to $1.02\lambda/2\mathbf{R}$ radians. The gain $G_o$ is equal to $$\frac{4\pi\,(R^2 - r^2)}{\lambda^2}.$$

Figure 3:
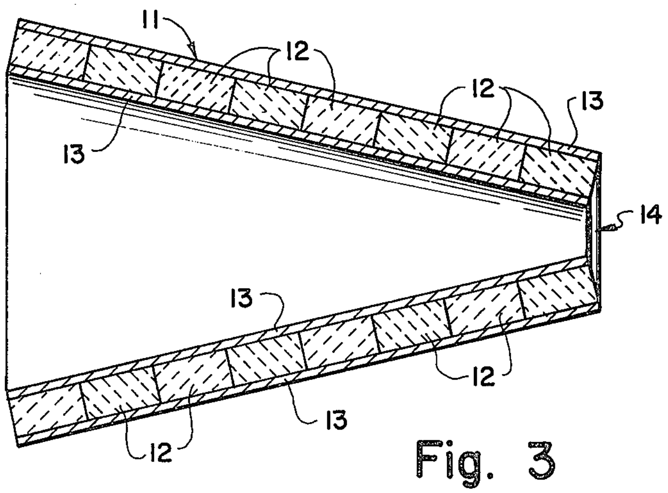
FIG. 3 is a sectional elevation of a frustoconical radiating member for use in the combination shown in FIG. 1.

With reference to FIG. 3, frusto-conical transducer 11 comprises a plurality of frustum segments 12 made of a piezoceramic material such as $BaTiO_3$ having an electrical coating 13 provided on the inner and outer surfaces to form the active surfaces. The segments can be compression fit in abutting relationship, or the electrically conductive coating 13 on the outer surface can be made continuous to electrically connect the segments in parallel. Alternatively, transducer 11 may be fabricated as a single unit having a conductive coating provided on the inner and outer surfaces.

Transducer 11 is mounted on reflector 10 in the same manner as conventional transducers using isolation or insulation mounting means (not shown). Conical reflectors for use with the transducers of the present invention may comprise an air-backed stainless steel cone having a thickness that is small in comparison to the wavelength. To achieve strength at ocean depths in sonar applications a honeycomb structure can be employed or the reflector molded from a syntactic foam comprising an epoxy containing small spheres of glass or ceramic.

With reference to FIG. 4, a frusto-conical radiating member 16 is shown. Radiating member 16 is made of a magnetostrictive material such as iron, nickel, nickel-iron alloy, nickel-cobalt, ferrite or the like. Radiating member 16 includes a single electrical winding 17. While radiating member 16 is shown as made from a single element, it is clear that the material can be laminated to reduce eddy current losses or made in two or more segments, each of which can be separately wound.

In FIG. 5, a frusto-conical radiating member 18 is shown having a single outer electrode 19 and inner electrode 21 divided in four 90° sections *a–d*. When radiating member 18 is used with a conical reflector, the combination functions as if four large conical radiating segments were used. This embodiment is thus useful in determining whether energy is coming to the device from a point on the axis or slightly off the axis. Accordingly, the combination of a conical reflector and radiating member 18 may be employed with a servo system to maintain the axis of the combination through an object that is being tracked.

Referring to FIG. 6, an alternative embodiment of the conical reflector and transducer of FIG. 1 is shown. In this embodiment a large diameter, short length reflector 22 is used in combination with a small diameter frusto-conical radiating member 23. This combination produces a large ring-shaped aperture distribution. Thus, the aperture distribution is similar to that shown in FIG. 2, except that the center region is substantially larger.

With reference to FIG. 7, conical reflector 26 is provided with frusto-conical transducer 27 having its apex theoretically located behind the apex of the reflector. As with the system shown in FIG. 1, the conical reflector half angle $$\phi = \frac{\pi}{4} + \frac{\theta}{2}.$$

The aperture distribution, however, is tapered as shown in FIG. 8. This is because the ratio of associated areas on the transducer and reflector cones is higher near the apex than near the rim. The tapered distribution provide less directivity than that provided by transducer 11 of FIG. 1, but reduced side lobes are obtained as well as a wider main beam.

Figure 9:
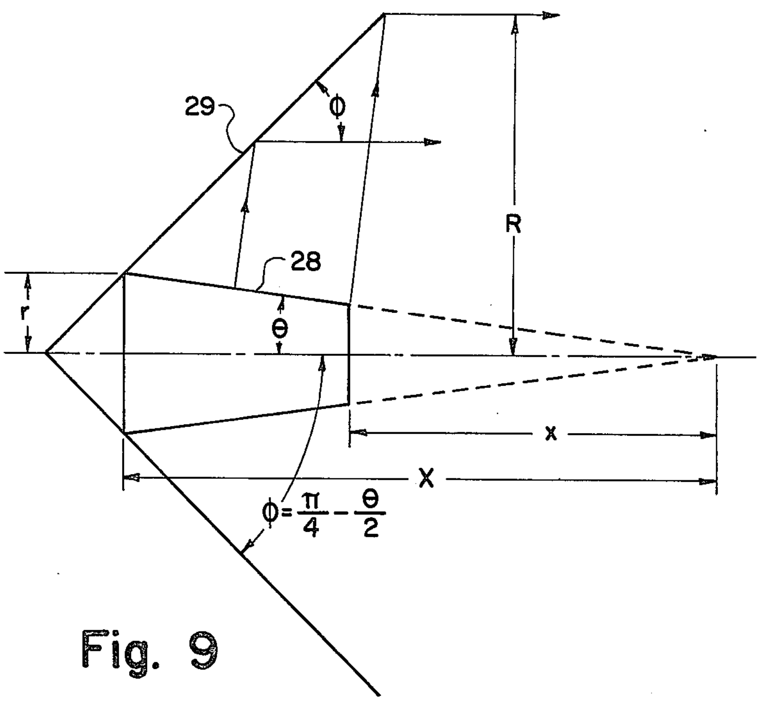
FIG. 9 is a diagrammatic view of a conical transducer havings its apex located in front of the conical reflector.
Figure 10:
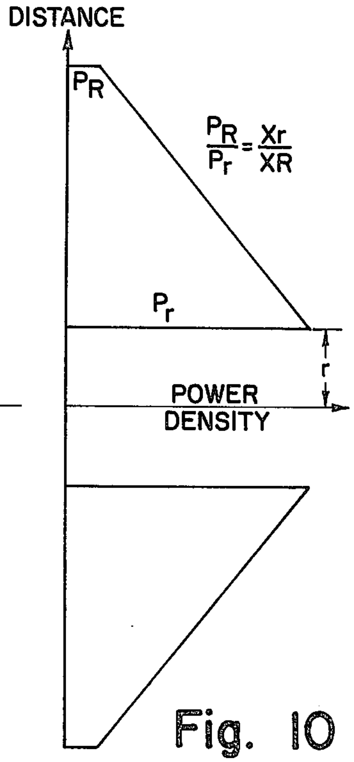
FIG. 10 is a graphical representation of the aperture distribution of the device shown in FIG. 9.

A substantially increased tapered aperture distribution can be obtained by positioning frusto-conical transducer 28 with its apex in front of reflector 29, FIG. 9. As can be seen from FIG. 10, by the aperture distribution of the energy from transducer 28, a greater reduction in side lobes is achieved with less directivity and a wider main lobe than transducer 27. The reflector half angle is $$\phi = \frac{\pi}{4} - \frac{\theta}{2}.$$

Figure 11:
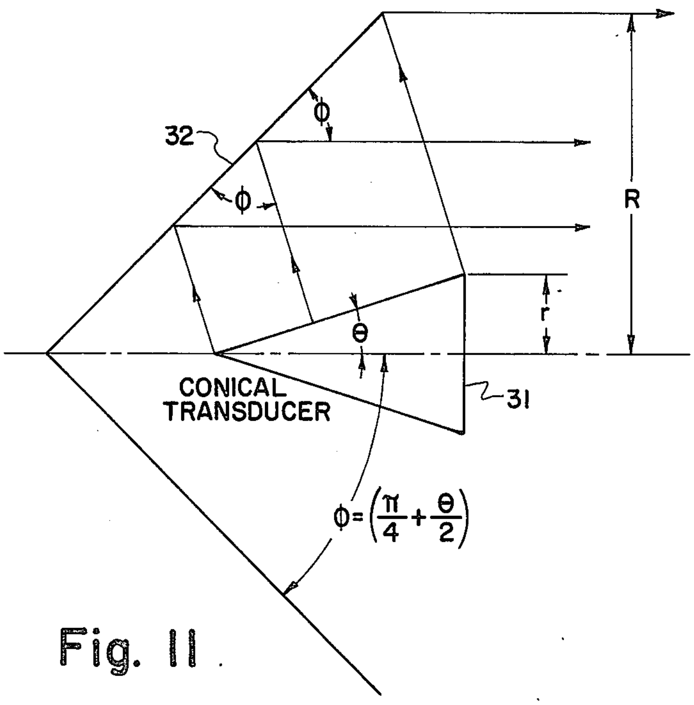
FIG. 11 is a diagrammatic representation of a conical transducer and conical reflector having inversely tapered aperture distribution.

Alternatively, an inversely tapered aperture distribution can be obtained, see FIG. 11. In this embodiment, conical transducer 31 has a half angle $\theta$, and the reflector half angle $$\phi = \frac{\pi}{4} + \frac{\theta}{2}.$$

The apex of conical transducer 31 is positioned in front of the apex of reflector 32.

Figure 12:
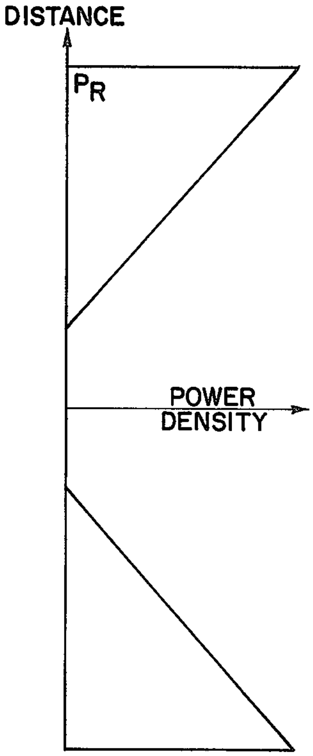
FIG. 12 is a graphical representation of the aperture distribution perpendicular to the axis of the combination shown in FIG. 11.

The aperture distribution of transducer 31 is shown in FIG. 12. Transducer 31 provides a reduced directivity and greater side lobes, but the main beam is sharper because of the low center amplitude.

Figure 13:
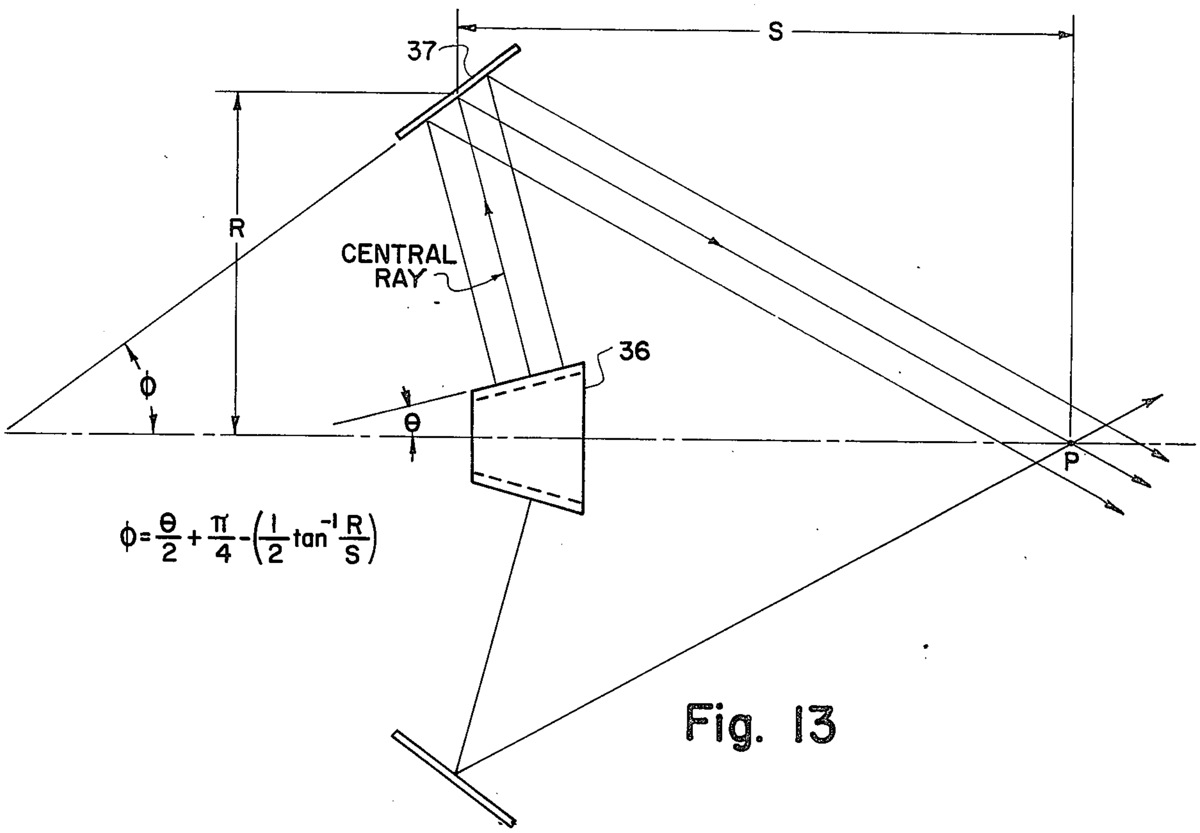
FIG. 13 is a digrammatic sectional representation of a frusto-conical transducer for use in combination with a frusto-conical reflector for directing energy at a point on the axis of the combination.

With reference to FIG. 13, a frusto-conical transducer 36 of the present invention is schematically shown in combination with frusto-conical reflector 37 to direct energy at point P. In this embodiment point P is a selected point of interest on the axis of transducer 36 and reflector 37. Where the apexes of the transducer and reflector are positioned on the same side of the combination, the reflector half angle $$\phi = \left(\frac{\theta}{2} + \frac{\pi}{4}\right) - \frac{1}{2}\tan^{-1}\frac{R}{S},$$

and, where the apexes are positioned on opposite sides of the combination, half angle $$\phi = \left(\frac{\pi}{4} - \frac{\theta}{2}\right) - \frac{1}{2}\tan^{-1}\frac{R}{S}$$

where,

R = the radius of the reflector at the point on the reflector where a reflected ray from point P is reflected to normally intersect the active surface of the transducer; and S = the distance of a point on the axis representing the center of radius R to point P.

Figure 14:
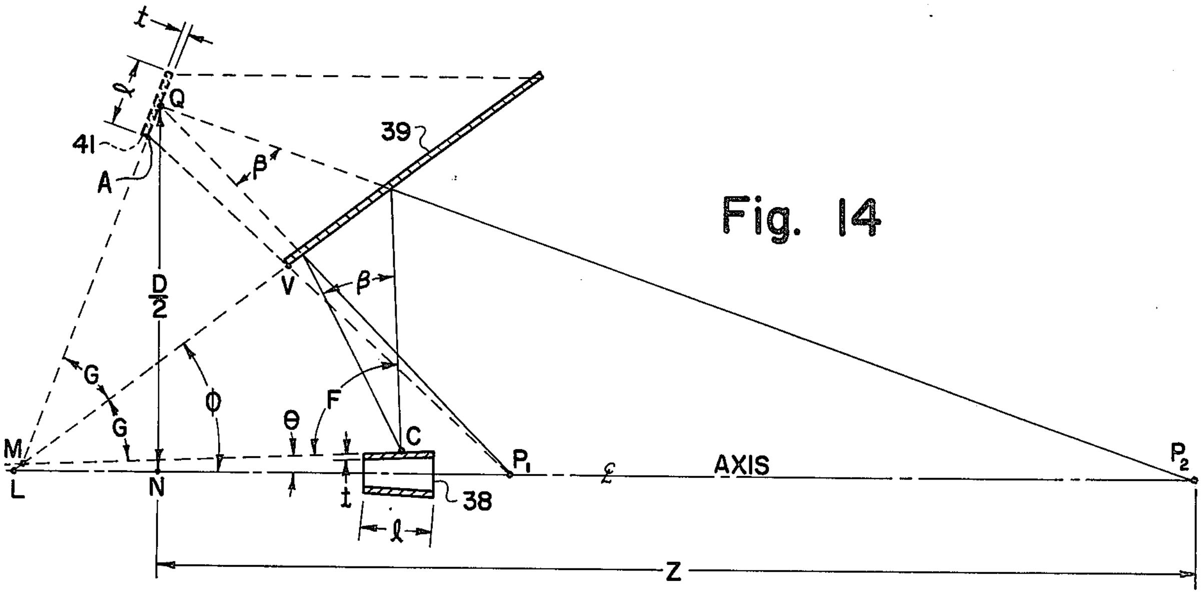
FIG. 14 is a diagrammatic representation of frusto-conical transducer for use in combination with a frusto-conical reflector (only half of which is shown) for directing energy between points $P_1$ and $P_2$ on the axis of the combination.

A special case of the combination described with respect to FIG. 13 is shown in FIG. 14. In this embodiment, the energy is directed between points $P_1$ and $P_2$ on the axis of the system. Frusto-conical transducer 38 having a face length $l$ is coaxially positioned within frusto-conical reflector 39. The following relationship determines the length $l$ of transducer 38 and its position with respect to reflector 39 for energy directed between points $P_1$ and $P_2$.

Transducer 38 has a maximum range point $P_2$ and a minimum range point $P_1$. The resolution $w$ desired at the maximum range determines the diameter D of an image conical transducer 41. The range $\overline{NP_2}$ is designated as Z.

$$D \approx \frac{\lambda Z}{w}$$

From D the center point Q on image 41 is determined. From center point Q lines are drawn to points $P_1$ and $P_2$, and the angle $P_1QP_2$ is designated as $\beta$. The length $l$ of transducer 38 is determined by the relationship:

$$\frac{l}{\lambda} \approx \frac{0.9}{\sin\beta}$$

Image transducer 41 is oriented so that its face is normal to the line $\overline{QP_2}$. Maximum energy will be directed toward point $P_2$ and no nulls will occur between point $P_1$ and $P_2$. The attenuation in the gas or liquid medium will determine the optimum value for $l$. A slightly smaller value will increase the energy at point $P_1$, but will decrease the amount of energy at point $P_2$. If $l$ is made much larger than the value given by the above equation, an objectionable null will occur between point $P_1$ and $P_2$.

Conical transducer 38 having half angle of $\pm\theta$, is coaxially positioned on axis $\overline{LP_2}$ such that $$\overline{MC} = \overline{MQ}.$$

Point C is at the center of the face of the cone cross section. The angle QMC is bisected with the line MT to produce the two angles designated as G. Reflector half angle $$\phi = (G + \theta).$$

The outside diameter of the conical reflector need be no greater than the outside diameter of the image of the transducer in the reflector. To make the device more compact a truncated conical reflector can be used that has an inside diameter determined by drawing a line from point $P_1$ to a point A on the inside diameter of image transducer face 41. The intersection of the line $\overline{P_1A}$ with $\overline{MT}$ is a point V which is a satisfactory point to truncate the small end of the reflector.

While presently preferred embodiments of the invention have been shown and described in particularity, it may be otherwise embodied within the scope of the appended claims.

What is claimed is:

1. An apparatus for transmitting and reflecting acoustical energy comprising a frusto-conical reflector and a transducer, said transducer comprising:

a frusto-conical radiating member positioned coaxially with respect to said reflector and having at least one active surface, the half angle $\phi$ of said reflector being related to the half angle $\theta$ of said radiating member in accordance with the formula $$\phi = \frac{\pi}{4} \pm \frac{\theta}{2}$$

for energy directed to or from a point of interest distant from said reflector and for energy to or from a point of interest on the axis in accordance with the formula $$\phi = \left(\frac{\pi}{4} \pm \frac{\theta}{2}\right) - \left(\tfrac{1}{2}\tan^{-1}\frac{R}{S}\right),$$

wherein

R= the radius of the reflector at a point where a ray from the point of interest is reflected normally to the surface of the radiating member, and S= the distance from the point of interest on the axis to a point on the axis where an imaginary line intersects the axis normally and a point on the reflector R distance from the axis.

2. An apparatus as set forth in claim 1 for use in a fluid medium and wherein said radiating member has a diameter greater than one wavelength of the acoustical radiation of the apparatus, a face width equal to approximately one such wavelength, and thickness that is resonant at the frequency of said apparatus.

3. An apparatus as set forth in claim 1 for use in a fluid medium wherein said radiating member is of a length equal to about one wavelength of the acoustical radiation of the apparatus in said fluid medium and wherein said reflector has an outer diameter greater than one such wavelength.

4. An apparatus as set forth in claim 1 for use with a solid medium and wherein said radiating member has a diameter greater than one wavelength of the acoustical radiation of the apparatus in said solid medium, a face width equal to approximately one such wavelength, a thickness that is resonant at the frequency of said apparatus, and wherein said reflector has an outer diameter greater than one wavelength.

5. An apparatus as set forth in claim 1 wherein the transducer consists of a piezoelectric conical shell with a single outer electrode and an inner electrode that is subdivided circumferentially into *n* equal segments.

6. Apparatus as set forth in claim 5 wherein said outer electrode is divided circumferentially into *n* segments.

7. Apparatus as set forth in claim 5 wherein said frusto-conical transducer is a magneto-strictive material that is divided circumferentially into *n* sectors, each sector containing a separate winding.

* * * * *